United States Patent
Eaton et al.

(10) Patent No.: US 7,456,722 B1
(45) Date of Patent: Nov. 25, 2008

(54) PROGRAMMABLE MICROTRANSFORMER

(75) Inventors: Deran S. Eaton, Waldorf, MD (US); Robert M. Daily, Swan Point, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 11/973,976

(22) Filed: Sep. 27, 2007

Related U.S. Application Data

(63) Continuation of application No. 11/650,759, filed on Dec. 15, 2006, now Pat. No. 7,298,238.

(51) Int. Cl.
*H01F 5/00* (2006.01)

(52) U.S. Cl. .................................. 336/200; 336/150

(58) Field of Classification Search .................. 336/65, 336/83, 150, 192, 200, 232; 361/35–38; 323/255–258
See application file for complete search history.

(56) References Cited

U.S. PATENT DOCUMENTS

| | | |
|---|---|---|
| 4,775,766 A | 10/1988 | Kooy et al. |
| 5,477,113 A | 12/1995 | Christoffersson |
| 5,872,489 A | 2/1999 | Chang et al. |
| 5,969,511 A | 10/1999 | Asselman et al. |
| 6,087,738 A | 7/2000 | Hammond |
| 6,232,841 B1 | 5/2001 | Bartlett et al. |
| 6,417,651 B1 | 7/2002 | Kronberg |
| 6,580,334 B2 | 6/2003 | Simburger et al. |
| 6,707,367 B2 | 3/2004 | Castaneda et al. |
| 7,298,238 B1 * | 11/2007 | Eaton et al. .................. 336/200 |
| 2002/0047769 A1 | 4/2002 | Fedeli |
| 2002/0130753 A1 | 9/2002 | Merriam et al. |
| 2004/0070893 A1 | 4/2004 | Ahn et al. |
| 2004/0100341 A1 | 5/2004 | Luetzelschwab et al. |
| 2005/0062575 A1 | 3/2005 | Gardner |

\* cited by examiner

*Primary Examiner*—Tuyen T. Nguyen
(74) *Attorney, Agent, or Firm*—Fredric J. Zimmerman

(57) ABSTRACT

A programmable transformer incorporating windings embedded in a thin film substrate. The windings are flat wire traces embedded into the substrate, primary on one side and secondary on the other. The secondary windings may be planar or different coils spatially arrayed throughout a thickness of the substrate. The secondary winding may include multiple tap points, effectively providing multiple secondary coils referenced to the single primary coil. Each tap point is bridged to a field effect or CMOS transistor path by which a digital controls permit dynamic adjustment of the turns ratio. The final secondary output depends on the activated transistor paths. Multiple secondary outputs from a single secondary coil and a digitally programmable turns ratio are available aspects.

17 Claims, 6 Drawing Sheets

PROGRAMMABLE MICROTRANSFORMER

The present application is a Continuation Application of prior U.S. patent application Ser. No. 11/650,759 filed on Dec. 15, 2006 now U.S. Pat. No. 7,298,238.

STATEMENT OF GOVERNMENT INTEREST

The invention described herein may be manufactured and used by or for the Government of the United States of America for governmental purposes without the payment of any royalties thereon or therefore.

BACKGROUND OF THE INVENTION

The present invention relates to microtransformers and, more particularly, to a programmable microtransformer design incorporating flat-wire windings embedded in a thin-film substrate, the secondary windings having multiple tap points connected to digital controls that permit dynamic adjustment of the turns ratio. The microtransformer layout is scalable based on the relative size of the circuit card on which it resides.

Electrical transformers are commonly implemented as discrete analog components. Most transformers are manufactured using an iron-based core material wrapped with wire windings, but this configuration increases their mass, volume and cost. Traditional fabrication methods preclude the use of common transformers as embedded systems (part of a larger overall system or product) because space confines require more versatile components. However, there are efforts directed toward developing thin-film transformers including Micro-Electro-Mechanical or "MEMS"-based transformers.

For example, US Patent Application 20050062575 by Gardner shows an integrated MEMS-based transformer in which coil windings are deposited on a substrate, and magnetic core material is included as interspersed layers between windings and dielectrics. The effective turns ratio of the Gardner construct depends on different material substrates, as well as the substrate layer thickness between windings.

U.S. Pat. No. 6,707,367 to Castaneda et al. shows an overlay transformer with flat wire coils on a substrate, primary on one side and secondary on the other. The secondary coils are tapped, and intermediate dielectric layers are incorporated. This disclosure is sharply limited to a specific octagonal geometry with two ("first" and "second") windings and no magnetic core material. The construction is based on traditional printed circuit manufacturing technology. Further, the inter-winding substrate thickness is assumed.

US Patent Application 20020130753 to Merriam uses multiple layers of non-conductive material with individual coil traces stacked to form a multi-turn transformer. Merriam also notes that transformers frequently provide variable voltage output and suggests a center tap layer. However, there is only one winding per layer, and ceramic substrate layers are used. The ceramic influences the effective turns ratio based on dielectric variance of the ceramic. In addition, a multi-layer ceramic (MLCC) method of building inductive elements is inferred, not a printed circuit board assembly process.

U.S. Patent Application No. 20040070893 to Ahn et al. shows a microtransformer for a high-performance system-on-chip power supply application-specific to a DC-DC converter. The coils are fabricated by patterned deposition on both sides of a substrate (the hallmark of a traditional printed circuit process). Multiple tap implementations are suggested.

U.S. Pat. No. 6,580,334 to Simburger et al. issued Jun. 17, 2003 shows a monolithically integrated transformer using slotted windings produced by silicon bipolar technology with three metallic layers. This patent states that "the absolute size of the transformer is virtually unimportant, but merely determines the frequency range of the optimum function or the inherent resonant frequencies. The diameter of an optimum transformer for frequencies from 800 to 900 MHz is, for example, about 400 um." (Column 4, Lines 8-12). However, this description is somewhat a misnomer, because to obtain a desired frequency and resonance response (even a desired power rating) the geometric physicality of the inductive element(s) constructed (i.e., 'absolute size') directly determines its claims and intended application, as does the circuit elements tied to it.

In summary of the above-described and other related art, these technologies intrinsically show that the desired performance depends on 1) microtransformer geometry; 2) construction methods; and 3) actual composition of matter used in making these types of devices (substitutions of materials in this area is not an obvious matter of design choice). Indeed, some of the foregoing examples simply cannot be built effectively using printed circuit board fabrication techniques because they require vertical angled traces (connecting layer-to-layer), and cannot be done without drilling a hole through the board.

The existing microtransformers have a second limitation in that their turns ratios are typically fixed, and it is difficult to dynamically configure and control the turns ratio. There is a second line of research directed toward varying the effective turns ratio using switched secondary taps.

For example, U.S. Pat. No. 6,417,651 to Kronberg, U.S. Pat. No. 5,969,511 to Asselman et al., and US Patent Application No. 20040100341 by Luetzelschwab et al. all use MEMs-switches to tune a high power transformer by selecting secondary winding taps. They provide a means of electronic switching using either SCR banks (Asselman) or digitally-controlled switches (Kronberg). However, they employ a multiplicity of discrete elements dedicated to high-energy power applications far in excess of the compact constructions envisioned by the present inventors.

U.S. Pat. No. 6,232,841 to Bartlett et al. issued May 15, 2001 shows an integrated tunable high efficiency power amplifier made from micro-electromechanical MEMs devices capable of being integrated with the control circuitry needed to produce the control signals and other amplifier components on a common substrate. The Bartlett U.S. Pat. No. 6,232,841 does combine an overlay transformer with an on-board switching network and a center-tapped transformer, but not multi-taps or layered coils.

Therefore, there remains a need for a programmable microtransformer design better-suited for MEMS-based manufacture and subsequent use in embedded systems that incorporate flat-wire windings embedded in a layered thin-film substrate, the secondary windings having multiple tap points connected to digital controls that permit dynamic adjustment of the turns ratio.

In all, the foregoing related art examples, size, frequency characteristics and energy capacity concerns drive the design variables, and so the stated goals implemented in a compact packaging of circuitry for a specific power load requires an entirely new set of geometries, materials and assembly.

SUMMARY OF THE INVENTION

It is, therefore, an aspect of the present invention to miniaturize analog transformer technology to fit within confined spaces without discrete components.

It is another aspect to reduce or eliminate magnetic core materials in miniature transformers.

It is another aspect to provide direct digital control over transformer turns ratios.

It is another aspect to provide a design for a programmable microtransformer that is better-suited for MEMS-based manufacture and subsequent use in embedded systems, and which incorporates flat-wire windings embedded in a layered thin-film substrate, the secondary windings having multiple tap points connected to digital controls that permit dynamic adjustment of the turns ratio.

These and other aspects are accomplished by a programmable microtransformer with windings embedded in a thin film substrate. The windings are flat wire traces embedded into the substrate, primary on one side and secondary on the other. The secondary windings may be planar or different coils spatially arrayed throughout the thickness of the substrate. Upon energizing the primary the resulting magnetic flux penetrates the substrate. The secondary has multiple tap points, effectively providing multiple secondary coils referenced to the single primary coil. Each tap point is bridged to a field effect or CMOS transistor path by which digital controls permit dynamic adjustment of the turns ratio. The final secondary output depends on which transistor paths are activated. Unlike conventional wound component transformers, it becomes possible to have multiple secondary outputs from a single secondary coil, and a digitally programmable turns ratio. Moreover, the microtransformer layout is scalable based on the relative size of the circuit card on which it resides. Thus, the transformer design is well suited for a MEMs based implementation.

A variety of embodiments are disclosed in an array of configurations, and with optional magnetic core.

DETAILED DESCRIPTION OF EXEMPLARY EMBODIMENTS

An exemplary embodiment of the invention is a programmable microtransformer design incorporating flat-wire windings embedded in a thin-film substrate, the secondary windings having multiple tap points connected to digital controls that permit dynamic adjustment of the turns ratio. A method of production is also disclosed.

Figure 1:
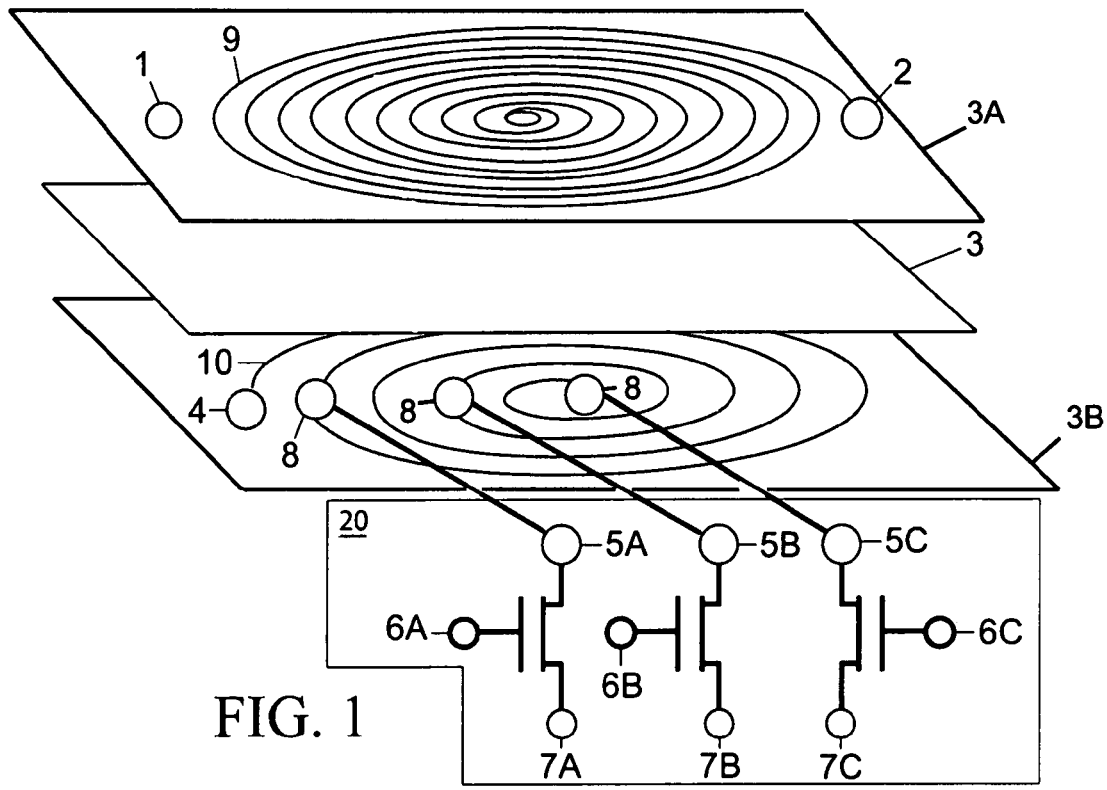
FIG. 1 illustrates a basic embodiment of a transformer according to the present invention with both of two windings embedded into a single layer substrate.

FIG. 1 illustrates a basic embodiment of a transformer 2 according to the present invention with both of two windings 9, 10, where each is partially, or completely, initially embedded into a substrate 3A and a substrate 3B, respectively. Substrates 3A and 3B are merged or sandwiched to form a single layer substrate 3 so that windings 9 and 10 are respectively, partially or completely, embedded into the single layer substrate 3. This embodiment is constructed with a flat wire trace as the primary winding 9. Primary winding 9, and its input leads 1, 2, are embedded into substrate 3 on one side, and secondary winding 10 is embedded on the other side. In operation, upon energizing the primary winding 9 with a variable current source, according to Faraday's Law, the primary winding 9 generates a magnetic flux that penetrates the substrate 3 inducing electrical current in the secondary winding 10. The secondary winding 10 includes multiple tap points 8 referenced to a common output lead 4. In an exemplary embodiment, the primary winding 9 is a flat wire trace, which is a single wire trace, and the secondary winding 10 is a multiple wire trace. However, in an alternative exemplary embodiment, primary winding 9 may be a multiple-coil wire trace and the secondary winding 10 may be a single wire trace. In this alternative exemplary embodiment, the tap points 8 in the secondary winding 10 may be connected to the single wire trace. In a further exemplary embodiment, there may be no tap points 8 connected to the secondary winding 10.

Further, regarding a description of the first exemplary embodiment, the tap points 1, 8 are positioned towards the center of the substrate 3. Each tap point 8 in the secondary winding is bridged to a transistive switching circuit 20 and, more particularly, field effect transistors (FETs) as shown. In an exemplary embodiment, the transistive switching circuit 20 is situated substantially adjacent the tap points 8. Further, the gates 6a-6c of the FETs are controlled by digital controls to permit dynamic adjustment of the turns ratio. The final secondary outputs at FET cathodes 7a-7c depend on which transistor paths are activated by the digital controls. This configuration provides great flexibility, allowing a designer to engineer magnetic fields having irregular shapes, opposing fields, flexible substrates, etc., all using layered printed circuit board fabrication techniques to embed a transformer into a printed circuit board substrate, as is well-suited for MEMS-based applications. Unlike discrete analog transformers, this layered embodiment with digital FET switching circuit makes it possible to have any number of secondary outputs 7a-7n using a single secondary winding 10. The substrate 3 in the illustrated embodiment is generally FR-4 fiberglass. It is noteworthy that the substrate 3 thickness between the primary and secondary coils 9, 10 also serves to adjust the effective turns ratio.

The above-described basic design can be adapted for current printed circuit board fabrication techniques to yield an array of different geometries. Specifically, the variance of shape and wire size (a function of design goals) dictates what turns ratios, frequency sensitivity and sensing operations may be implemented as a manner of design methodology. The geometry is also a function of available packaging volume.

Figure 7:
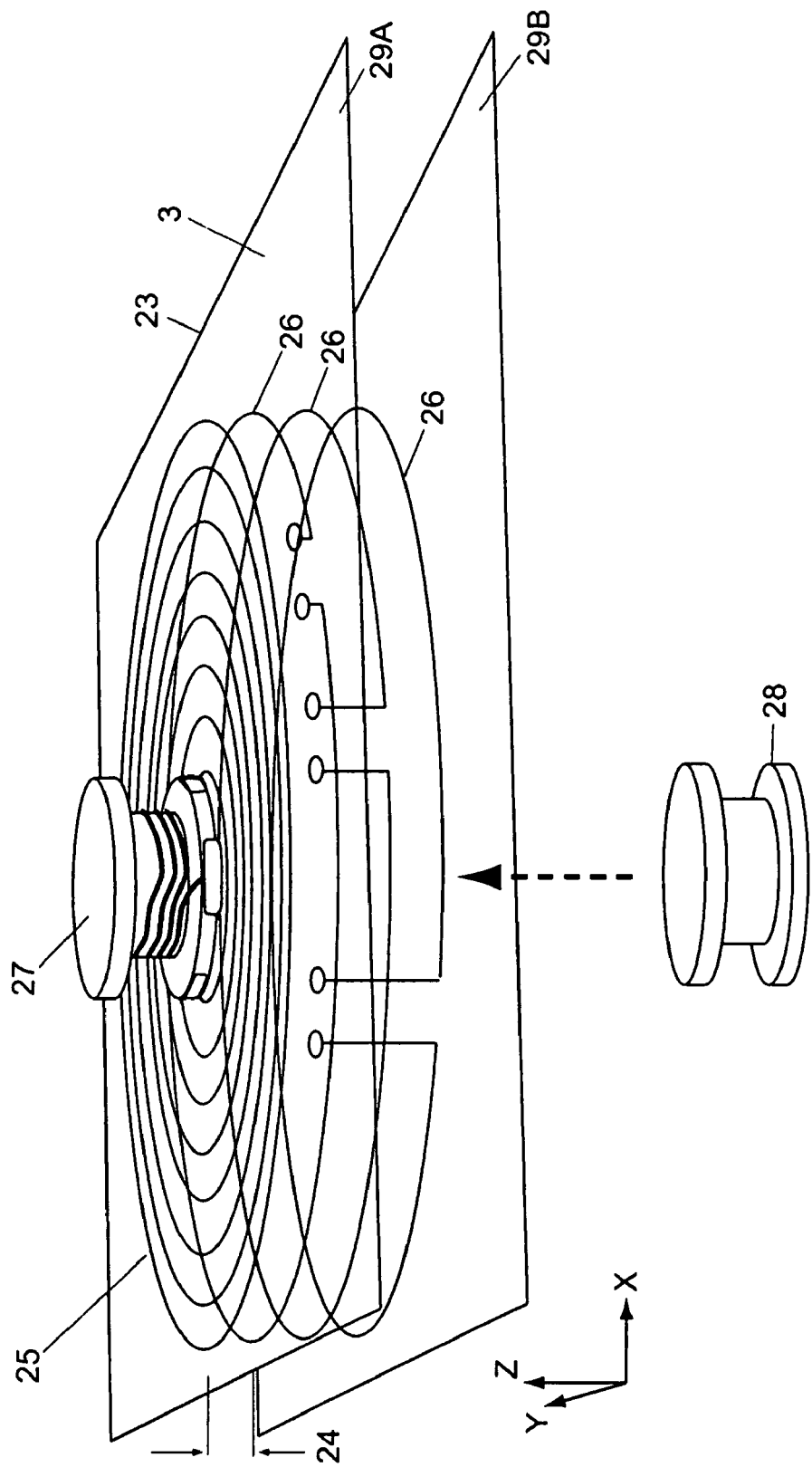
FIG. 7 illustrates a hybrid configuration between a core and a coreless transformer.

FIG. 7, for example, illustrates a hybrid configuration between a core and a coreless transformer. In particular, a current microtransformer prototype includes radial arc symmetry and asymmetric coils due the shape difference between the inner and outer coils.

Figure 2:
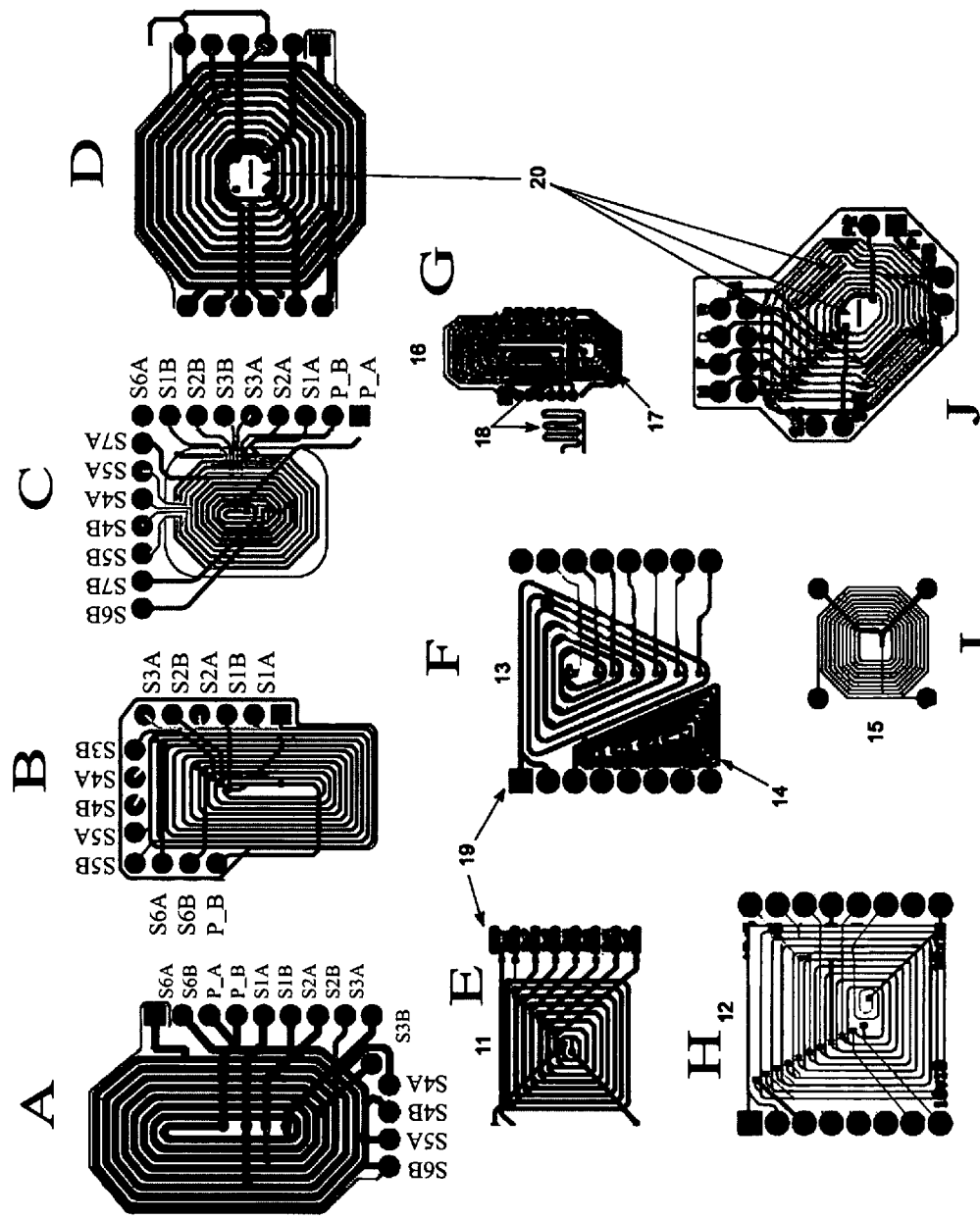
FIG. 2 illustrates various geometries for programmable microtransformers that are attainable by layered printing techniques.

To further illustrate the flexibility, FIG. 2 (A-J) illustrates various geometries for programmable microtransformers that are attainable by layered printing techniques. For purposes of illustration the transistive switching circuit 20 of FIG. 1 is not shown. The variants include reshaped coil geometries such as: 1) inductively coupled, multiple tap transformers layered through the substrate; 2) coil (winding) stacking; 3) offset coils; 4) dual proxima transformers; and 5) serpentine sense lines. All have multiple tap points, and some are configured with central spaces for magnetic core insertion. The variants A-J may be categorized and subcategorized as follows:

1) Inductively coupled, multiple tap transformer windings layered through the substrate.
   Octagonal with six pairs of tap points S1A & S1B through S6A & S6B as shown at A.
   Rectangular with six pairs of tap points S1A & S1B through S6A & S6B as shown at B.
   Octagonal with six pairs of tap points S1A & S1B through S6A & S6B as shown at C.

2) Coil stacking of Windings.
   Octagonal with four pairs of tap points as shown at D.
   Square with six pairs of tap points as shown at H.

3) Offset Coils
   Adjacent triangular with seven pair of tap points as shown at F.
   Adjacent octagons with six pair of tap points as shown at G.

4) Dual Proxima Transformers
   Dual Proxima Transformers (also offset as at F, G)

5) Serpentine Sense Lines
   Serpentine Sense Lines 20, in irregular rectilinear form with six pairs of tap points as shown at J.

6) Rectilinear and Nested Loops
   Nested Single Loops On A Common Layer as at C and D.
   Square with four pairs of tap points as shown at E.
   Octagonal with one pair of tap points as shown at I.

Figure 3:
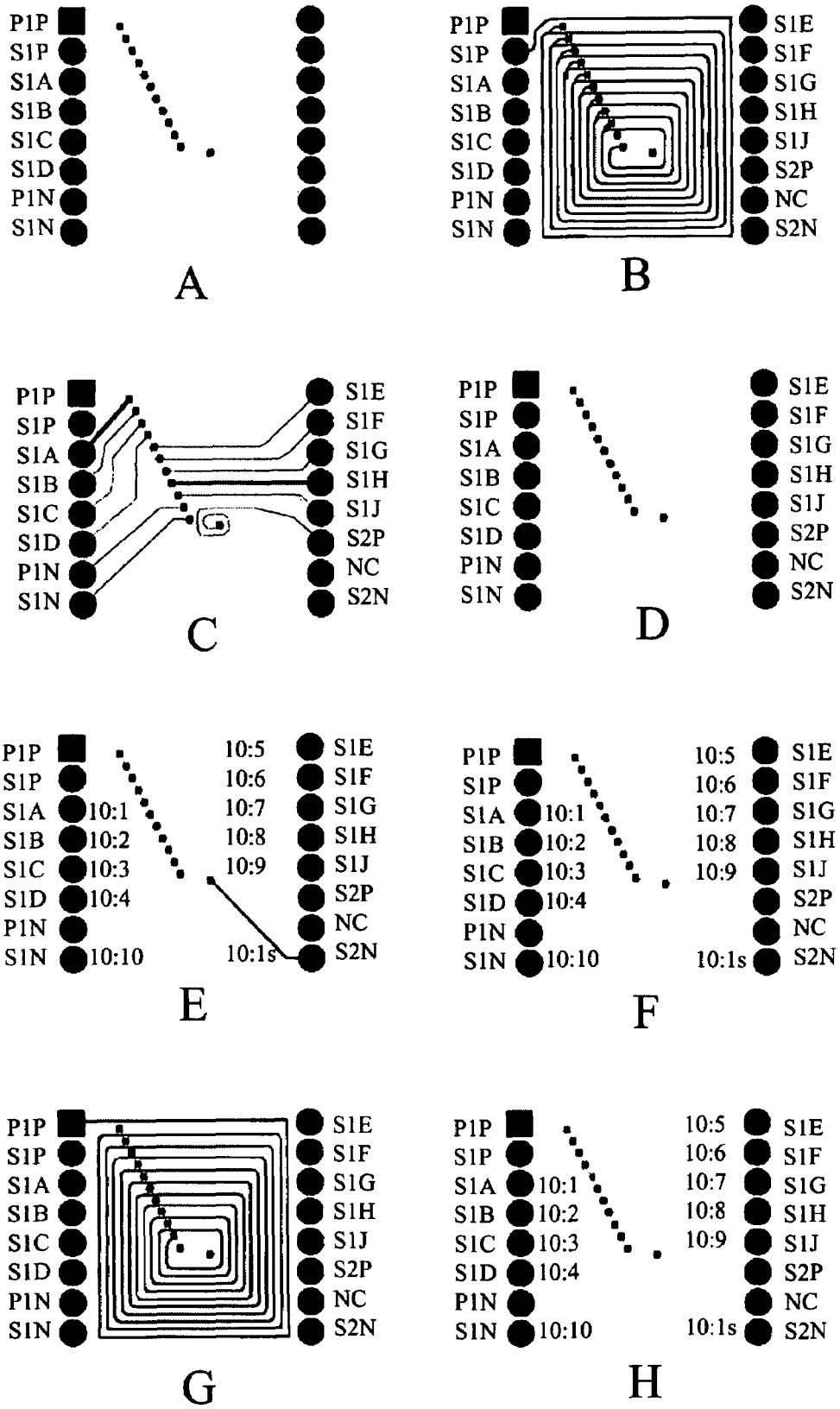
FIG. 3 illustrates the various (eight) layers of an inductively coupled, multiple tap octagonal transformer.

To illustrate how the above-described designs can be achieved using layered printed circuit board fabrication techniques, FIG. 3 illustrates how the inductively coupled, multiple tap octagonal transformer with six pairs of tap points S1A & S1B through S6A & S6B as shown at A can be printed on eight layers A-H.

Additional variations on the coil geometries follow.

Larger Elements

The foregoing coil geometries are generally for low to moderately energetic signals, and have been tested as viable up to approximately 50-85 watts. However, higher wattage programmable microtransformers are achievable using larger elements, though for such implementations the power rating is also determined by the device's ability to dissipate heat. Opening the separation distance between coil turns reduces thermal operating effects, but also increases the circuit board volume required to implement the transformer.

Accommodating higher energy signals mandates using a printed circuit board substrate, as the basic coil geometry of FIG. 1, when enlarged, makes an efficient heat radiator. The FETs 20 must be replaced with power transistors to manage the electrical loads.

Asymmetric Elements

With the above-described method it becomes possible to have practical transformers made using irregular or asymmetric shapes where traditionally symmetric design proves inadequate. Further, the lamination of substrate versus wire thickness alters the effective turns ratio based on the material properties of the substrate and the thickness of it between electrically conductive layers (see the "Spatial Effective Ratio" construct described below).

Magnetic Transformer Core Deposition

While the primary implementations described above are coreless, it is well-known that the intercoil gap configuration contributes significantly to coupling efficiency and the effective turns ratio. An exemplary embodiment also encompasses the insertion of core materials between windings to more tightly couple magnetic flux through the microtransformer.

Figure 4:
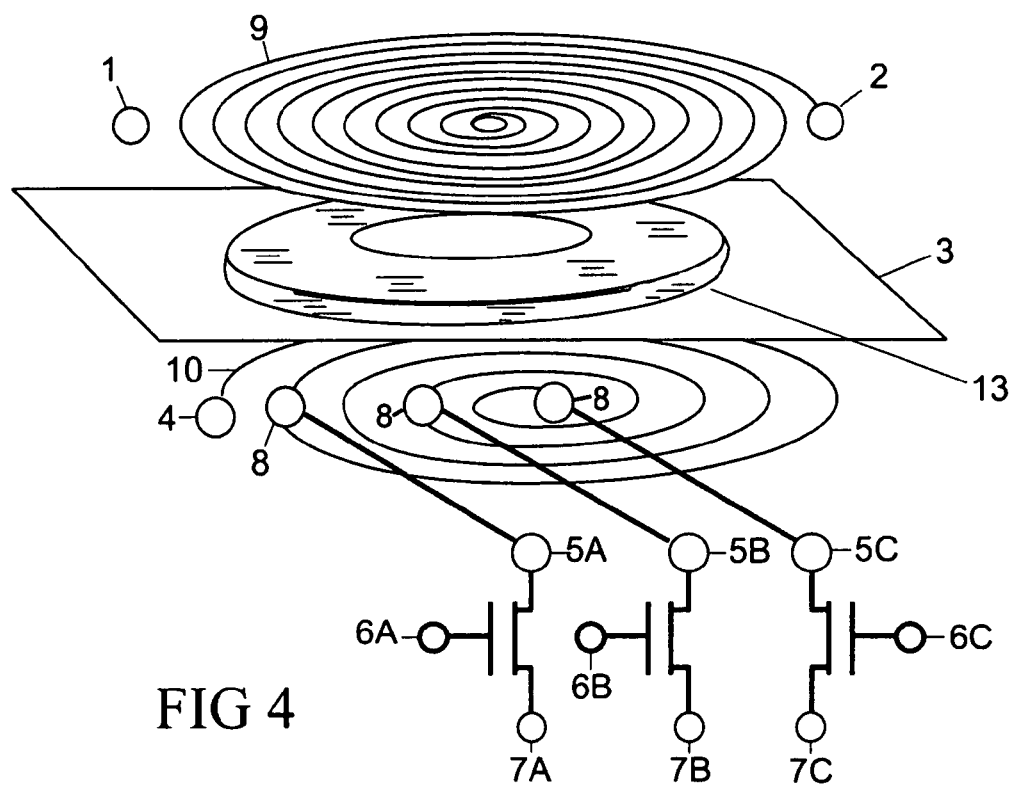
FIG. 4 illustrates an intercoil core.

FIG. 4 illustrates the inclusion of an intercoil core 13, which is essentially an iron washer-shaped core embedded in the epoxy substrate 3 between primary and secondary windings 9, 10 and, in this exemplary embodiment, completely embedded in the epoxy substrate 13. The intercoil core 13 is substantially intermediate the primary winding 9 and the secondary winding 10. Accordingly, based on this exemplary configuration, overall frequency response is broadened, that is, a frequency range is increased to include lower frequencies. Further, for higher power transformer applications #22 gauge transformer wire may be used for core 13, and for lower power application strips of magnetic tape or other thin film magnetic material may be laminated between the windings 9, 10 (common "VHS" videotape may be used for this). A PCB-embedded thin film deposition of iron, ferrite-doped resin or other typical electromagnet core material 13 in the substrate 3 between coils 9, 10 generally provides good performance in a smaller package.

Coil Layer Inversion

The embodiment of FIG. 1 includes each microtransformer winding 9, 10 on top and bottom surfaces respectively, with the tap points 1, 8 toward the center of the substrate 3. However, a mirrored construct is also feasible, where the windings 9, 10 are more proximate to the substrate 3 center and the tap points 1, 8 are on the top and bottom.

Flex Circuit Construction

Figure 5:
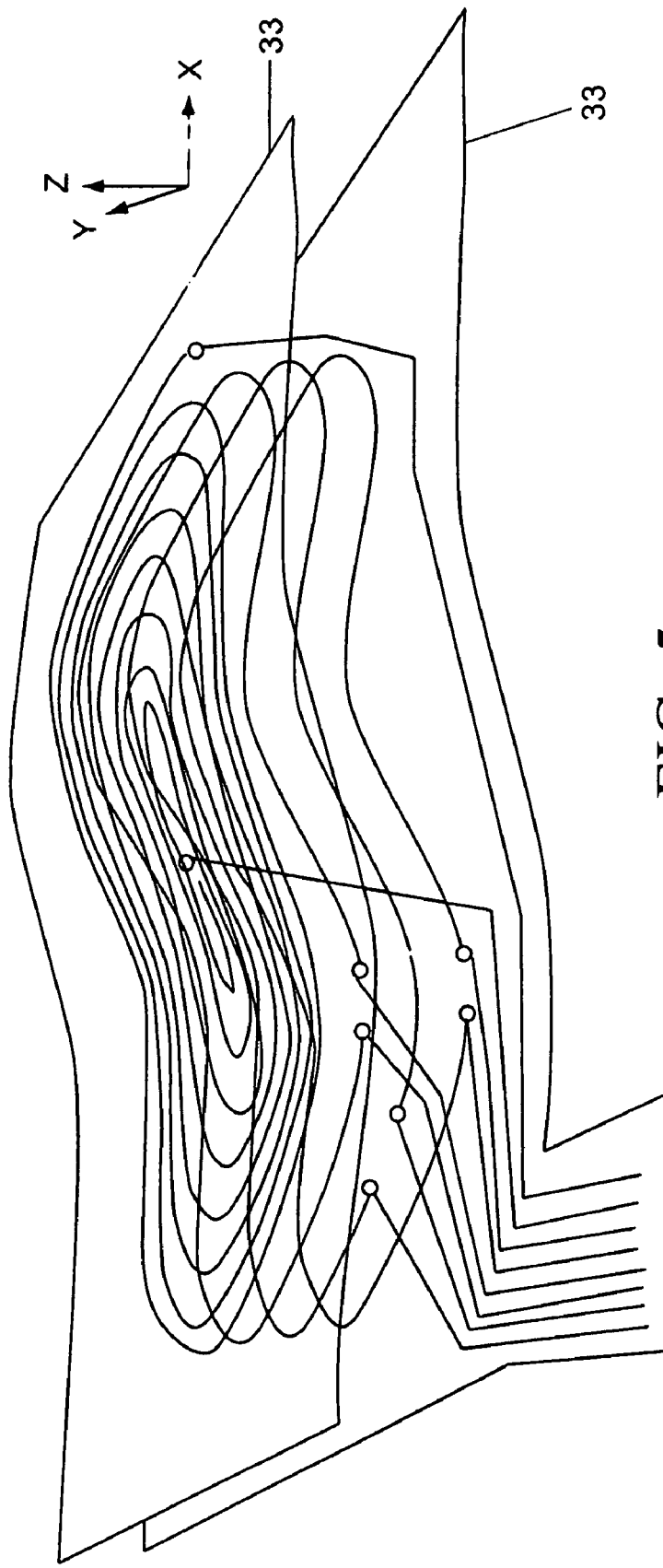
FIG. 5 illustrates a flexible substrate is employed for each layer.

While the embodiment of FIG. 1 employs a materially rigid fiberglass substrate 3, it is possible to employ a flexible substrate that permits the designer to engineer magnetic fields having irregular shapes, or opposing fields driven in parallel by a common signal source. FIG. 5 shows one example of this configuration where a flexible substrate 33 is employed for each layer. The flexible substrate 33 may be a flexible polyamide film with conductive windings and traces printed thereon. Flexible printed circuits are thin, lightweight, flexible, and durable, which can meet a wide range of temperature and environmental extremes, and can conform to the interior or exterior housings of many existing devices, taking up very little additional space.

Spatial Effective Ratio SER

Figure 6:
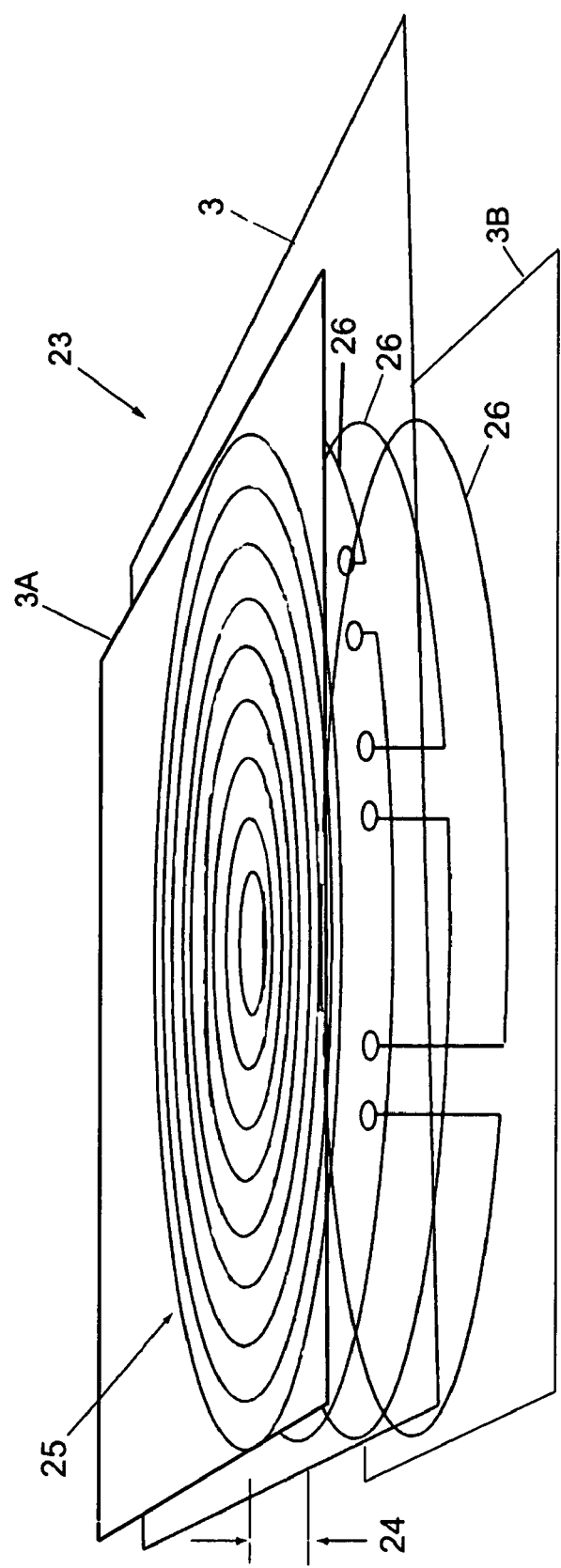
FIG. 6 illustrates a programmable microtransformer with a variable layer space for wider frequency range.

The above-described programmable microtransformer design can also be varied to exploit spatial and material substrate properties between windings. FIG. 6 illustrates a programmable microtransformer 23 having a fixed nominal turns ratio, but the programmable effective turns ratio is also determined by the particular coil layer 26 tapped into and the layer space 24, which is potentially variable relative to the primary winding 25. Thus, the programmable effective turns ratio is varied by changing the coil layer 26 and an effective layer space 24, not by a multiple tap secondary winding 10 as in FIG. 1, as well as the selection of various materials for the substrate 3. As such, this configuration is most effective when employing at least eight layers, leaving the substrate surface layers with top 29A and bottom 29B available for parts placement as indicated in FIG. 7. It has been determined through testing that a device as in FIG. 6 incorporating a spatial effective turns ratio can achieve step-down performance far in excess of the fixed nominal turns ratio. For example, given a nominal 10:1 turns ratio with only two windings, it is possible to perform at the level of a 100:1 transformer because FR-4 substrate 3 separated the coils at nearly the full circuit board thickness 0.062 inches. Closer coil-to-coil proximity strengthens the coupling coefficient, yielding a spatial effective ratio equation as follows:

$$N2_e/N1e = N2n/N1n(\mu Z \times T_L)$$

where N denotes the effective and nominal turns ratios, μZ denotes the material scalar effects of each substrate layer, and $T_L$ denotes the thickness of each separating layer.

The transformer can easily adapt to use a hybrid construct like that in FIG. 7, which employs discrete minitransformers or inductors 27, and/or magnetic core elements 28.

The hybrid configuration of FIG. 7 has the advantage of a wider frequency range depending on the discrete part chosen, as the hybrid construction augments the performance of the embedded windings. The advantages of the hybrid discrete mini-/micro-transformer construct are as follows:

1) Increased operating bandwidth: Generally, the discrete mini-transformer is at first a surface-mountable inductor having a ferrite or other magnetically sensitive bobbin material. The core bobbin ensures a frequency response favoring lower bands, confirmed in the specifications for such devices. The mini-transformer is formed by winding a secondary turn of magnet wire around and over the stock part. To date, coreless microtransformers that have been tested have a higher frequency response than those with cores. Thus, in switched combination, this construct makes compact wideband transformers possible.

2) Magnetic flux sensing: Used together with the mini-transformer as the primary and secondary, the microtransformer may be used as an off-resonance, isolated input to sense magnetic field strength in high energy circuits.

3) Increased heat dissipation: Being geometrically close to the microtransformer permits the discrete mini-transformer to dissipate any heat generated in the microtransformer as substrate thermal conduction permits, and vice versa.

Common Layer Nested Turns

Given an ample geometry, nesting multiple coils inside single or multiple coils on the same layer is also possible. See, for example, the nested single loops on a common layer as seen in FIG. 2 at C and D, or square with four pairs of tap points shown at E, and octagonal with one pair of tap points as shown at I. These configurations closely couple flux density without vertical coil spacing. One novelty of these types is their potential to employ fractional symmetry and serpentines in their coil constructs e.g., FIG. 2 embodiments F & G items 14, 17 and 18, respectively. Serpentine circuits 18 are useful also in mitigating induced currents when switching and impedance adjustment elements are added immediately above and below the substrate embedded transformer windings. Serpentine twists are balanced with respect to the magnetic flux of the transformer Advantages In all the above-described embodiments, the concept of a programmable microtransformer design incorporating flat-wire windings embedded in a thin-film substrate, with secondary windings having multiple tap points connected to digital controls that permit dynamic adjustment of the turns ratio adds repeatable performance aspect that traditional, discrete component transformers cannot match. The list of features and their advantages are many:

High Energy Compactness—For the performance yield compared to traditional discrete transformers, programmable microtransformers are extremely small. Further, their compactness allows the superimposition of other circuit elements, allowing for more compact circuit assembly techniques while achieving a higher energy handling capacity than integrated circuit implementations of prior methods.

Variable Geometry—Unlike discrete units, programmable microtransformers may be assembled to suit most any geometry and packaging method (as seen by FIG. 2).

Highly Dynamic Turns Ratio—The effective turns ratio of any programmable microtransformer is decided by both the selectable, nominal turns ratio and the coupling gap distance between active coils. This ratio takes advantage of spatial physics, making it possible to process large voltage signals effectively through digital circuits while reducing the signal processing components necessary to do so. Fractional turns ratios are also achievable using geometric variance—e.g., the bi-triangular model of FIG. 2F.

Reduced Parts Count—Since printed circuit boards must be built to hold many electronic circuit elements, it makes economic sense to reduce parts count wherever possible during mass production. Depending on the exact preference, programmable microtransformers may be built combining coils with digital switching elements into the same device, or embed coils in the printed circuit while hosting digital switching elements discretely. Either method reduces overall parts count.

Having now fully set forth an exemplary embodiment and certain modifications of the concept underlying the present invention, various other embodiments as well as certain variations and modifications of the embodiments herein shown and described will obviously occur to those skilled in the art upon becoming familiar with said underlying concept. It is to be understood, therefore, that the invention may be practiced otherwise than as specifically set forth in the appended claims.

Finally, any numerical parameters set forth in the specification and attached claims are approximations (for example, by using the term "about") that may vary depending upon the desired properties sought to be obtained by the present invention. At the very least, and not as an attempt to limit the application of the doctrine of equivalents to the scope of the claims, each numerical parameter should at least be construed in light of the number of significant digits and by applying ordinary rounding.

What is claimed is:

1. A programmable transformer, comprising:
   a circuit board substrate;
   a primary winding comprising a flat-wire trace being embedded on one side of said substrate, and a pair of input leads connecting to said primary winding;
   a secondary winding comprising a multiple-coil wire trace being embedded on another side of said substrate;
   a plurality of tap leads each connecting to said secondary winding; and
   a transistor switching circuit comprising a plurality of gated FETs each gated FET connecting to one of the plurality of tap leads for selectively connecting said secondary winding to a pair of output leads,
      wherein gates of said plurality of gated FETs are controlled by controls to permit dynamic adjustment of effective turns ratio of said programmable transformer.

2. The programmable transformer according to claim 1, wherein said circuit board substrate is comprised of FR-4 fiberglass.

3. The programmable transformer according to claim 1, wherein said circuit board thickness between the primary winding and the secondary winding is predetermined to adjust the effective turns ratio of said programmable transformer.

4. The programmable transformer according to claim 2, further comprising a magnetic core material interposed between said primary winding and said secondary winding.

5. A programmable transformer, comprising:
   a plurality of layers of circuit board substrate;

a primary winding comprising a flat-wire wire trace being printed on one of said plurality of layers of circuit board substrate, and a pair of input leads connecting to said primary winding;

a secondary winding comprising a multiple-coil wire trace printed on other of said plurality of layers of circuit board substrate;

a plurality of tap leads each connecting to one of the multiple-coil wire traces of said secondary winding; and a transistor switching circuit comprising a plurality of gated FETs each gated FET connecting to one of the plurality of tap leads for selectively connecting at least one of the multiple-coil wire traces to a pair of output leads, wherein gates of said plurality of gated FETs are controlled by digital controls to permit dynamic adjustment of effective turns ratio of said programmable transformer.

6. The programmable transformer according to claim 5, wherein each coil of said multiple-coil wire trace comprises a single coil printed on one of said plurality of layers of circuit board substrate, and said plurality of tap leads comprises a corresponding number of tap leads each resident on and connected to a corresponding said multiple-coil wire trace.

7. The programmable transformer according to claim 5, further comprising a magnetic core material interposing between said primary winding and said secondary winding.

8. The programmable transformer according to claim 7, wherein said magnetic core material is an embedded thin film deposition of electromagnet core material in said circuit board substrate situated between said flat wire trace and said multiple-coil wire trace.

9. The programmable transformer according to claim 5, wherein a thickness of said plurality of layers of circuit board substrate is predetermined to adjust the effective turns ratio of said programmable transformer.

10. A programmable microtransformer, comprising:

a circuit board substrate;

a primary winding comprising a flat-wire trace being embedded into one side of said circuit board substrate, and a pair of input leads connecting to said primary winding;

a secondary winding comprising at least one multiple-coil wire trace embedded into another side of said circuit board substrate;

a plurality of tap leads each connecting to one of said at least one multiple-coil wire trace;

a transistor switching circuit comprising a plurality of gated FETs each gated FET connecting to one of the plurality of tap leads for selectively connecting at least one of the multiple-coil wire traces to a pair of output leads;

whereby gates of said plurality of gated FETs are controlled to permit dynamic adjustment of the effective turns ratio of said programmable transformer.

11. The programmable transformer according to claim 10, wherein each of coil of said at least one multiple-wire trace comprises a single coil printed on one of said circuit board substrate, and said plurality of tap leads comprises a corresponding number of tap leads each resident on and connected to said corresponding coil of said secondary winding.

12. The programmable transformer according to claim 10, further comprising a magnetic core material interposing between said primary winding and said secondary winding.

13. The programmable transformer according to claim 12, wherein said magnetic core material is an embedded thin film deposition of electromagnet core material in said circuit board substrate between said flat-wire trace and said at least one multiple coil wire trace.

14. The programmable transformer according to claim 10, wherein a thickness of plurality of layers of said circuit board substrate is predetermined for adjustment of an effective turns ratio of said programmable transformer.

15. The programmable transformer according to claim 10, wherein said primary winding and said secondary winding each include a radial arc symmetry, and wherein said primary winding is asymmetric in relation to said secondary winding.

16. The programmable transformer according to claim 12, wherein said magnetic core material is an iron washer-shaped core embedded in the circuit board substrate between said primary winding and said secondary winding.

17. A programmable transformer, comprising:

a circuit board substrate;

a primary winding comprising a multiple-coil wire trace being embedded on one side of said substrate, and a pair of input leads connecting to said primary winding;

a secondary winding comprising a single-wire trace being embedded on another side of said substrate;

a plurality of tap leads each connecting to said single-wire trace; and a transistor switching circuit comprising a plurality of gated FETs each gated FET including an anode connecting to one of the plurality of tap leads for selectively connecting said secondary winding to a pair of output leads, wherein gates of said plurality of gated FETs are controlled by controls to permit dynamic adjustment of effective turns ratio of said programmable transformer.

* * * * *